United States Patent [19]

Kramer et al.

[11] 4,413,257
[45] Nov. 1, 1983

[54] CONDUCTIVE PARTICLE LEAD TERMINATION FOR AN ELECTRO-OPTIC DISPLAY

[75] Inventors: Gordon Kramer, Huntington Beach; Elias J. Lara, Elsinore, both of Calif.; Andrew F. Wollmann, Chandler, Ariz.

[73] Assignee: Beckman Instruments, Inc., Fullerton, Calif.

[21] Appl. No.: 282,673

[22] Filed: Jul. 13, 1981

[51] Int. Cl.³ .................................................. G08B 5/00
[52] U.S. Cl. .......................... 340/815.01; 340/815.07; 340/815.2; 340/787; 361/417; 29/592 R; 350/343
[58] Field of Search ............... 340/815.01, 815.02, 340/815.04, 815.07, 815.2, 718, 784, 789, 785; 315/169.1, 169.2, 169.3, 169.4; 361/400, 403, 416, 417, 418; 350/343, 344; 29/592

[56] References Cited

U.S. PATENT DOCUMENTS

| | | | |
|---|---|---|---|
| 3,742,600 | 7/1973 | Lowell | 29/592 |
| 3,936,930 | 2/1976 | Stern | 29/592 |
| 4,148,128 | 4/1979 | Feldman | 29/592 |
| 4,308,533 | 12/1981 | Schmidt | 340/784 |

FOREIGN PATENT DOCUMENTS 2602183 of 0000 Fed. Rep. of Germany.

OTHER PUBLICATIONS

IBM Technical Disclosure Bulletin, vol. 15, No. 8, Jan. 1973.

*Primary Examiner*—Donnie L. Crosland
*Attorney, Agent, or Firm*—R. J. Steinmeyer; F. L. Mehlhoff; William H. May

[57] ABSTRACT

An electrode termination assembly for use on a display device wherein the amount of space required for the pin connector to attach to the display device is greatly reduced, the physical and electrical integrity of the assembly is greatly enhanced and the cost of the assembly is reduced as compared to present assemblies for pin connectors. An adhesive material having conductive particles is used to not only physically support and attach the connector pins to the display, but also electrically connect the connector pins to electrode pads on the display.

9 Claims, 8 Drawing Figures

CONDUCTIVE PARTICLE LEAD TERMINATION FOR AN ELECTRO-OPTIC DISPLAY

BACKGROUND OF THE INVENTION

The present invention is directed to the connection or interface between pin connectors and an electro-optic display and, more particularly, is directed to a method of interfacing pin connectors with a display device in a simplified manner such that the overall size of the display with the pin connectors is minimized and the physical and electrical integrity of the connection is improved.

In order for an electro-optic display to operate, it is necessary to electrically connect it with some type of exterior electronics in order to address the display electrodes of the display device to present the visible character or message desired in the display. Typically, the interconnection between the display device and the driving electronics is accomplished by the use of some type of pin connector arrangement. However, the interface with many electro-optic display devices is inherently difficult. It is a widely present practice to utilize pin connectors that have generally U-shaped cross-sectional clamp ends which are designed to snap on to one of the plates or substrates that make up the display device. These pin connector devices are generally acceptable, but their reliability is somewhat questionable, since they can become askewed on the plate. Consequently, it is typically required that some type of sealing or adhesive means also be applied to the pin connector to secure it in place. Also, the use of the pin connectors requires too much undesirable manual labor in order to position the pin connectors on the display. Many problems can arise regarding proper alignment as well as damage to the pin connectors which are somewhat fragile by the manual placement of the connectors on the display.

Alternate approaches which have been used include the utilization some type of clip-on connector which can be designed for soldering in place. This type of approach is very reliable, but it is also very costly and unacceptable with respect to the desire to keep costs to a minimum in producing a display.

When using clip-on or pin connectors that snap onto the display, it is necessary to have a multitude of types and sizes of connectors available since displays will vary in size as well as the location of the terminations to which the pin connector attaches. Therefore, no uniform type of connector is possible when using plates that may be of varying sizes and thicknesses as well as having various different overall configurations of display devices.

One of the more noticeable disadvantages of many types of pin connectors or clip-on connectors to display devices is the fact that they result in a significant increase in the overall size of the display. This is a disadvantage to the customer who, in many instances, is trying to minimize the amount of space required by the display in his particular product into which the display device is to be placed. Consequently, the customer may have to allocate more space in his device than he would desire for mounting of the display in his device.

One alternative to the problem is to provide custom clip-on type connectors, but this would be a very costly approach. To provide the customer with a particular connector that is specifically adapted for his requirements would be cost prohibitive, especially in small quantities.

SUMMARY OF THE INVENTION

The present invention is directed to the utilization of an adhesive material placed on the termination pads of the display in which are securely positioned simply designed connector pins. The adhesive material is filled with a relatively low percentage of conductive particles. Consequently, when the connector pins are placed in the adhesive material, the conductive particles in the adhesive material will provide for electrical connection between the connector pin and the termination pad on the display. Typically, some type of containment strip or plate would be placed over the pins to enclose them and form a recess for enclosing the adhesive material. The size of the particles and the amount of distribution in the adhesive material will ensure vertical connection between the conductor termination pads and the pin, but will not result in any lateral electrical connection which would result in possible electrical shorts between termination pads. The diameter of the conductive particles would be much less than the spacing between the laterally arrayed termination pads, for example, the diameter of the particles would be one-tenth the distance between the pads. The concentration of particles is such that adjacent particles do not electrically connect with each other. By way of example, the number of particles per unit of area times the cross-sectional area per particle should be less than 0.1.

In an alternate approach of the present invention, the opposing plates of a display extend beyond the sealed enclosed envelope of the display and form a recess into which the adhesive material can be placed for receipt of pin connectors. Also, any electrodes on opposing plates can interconnect to termination pads on each of the respective plates for electrical connection to pins which are placed within the recess. Consequently, separate interconnections within the display would not be necessary for bringing the electrical connection for an opposing plate's electrode onto a common edge on the other plate.

The present invention is designed, therefore, to eliminate the requirement for connector arrangements which require a considerable amount of space that increases the overall dimension of the display. Therefore, it is possible to provide a display with pin connectors for connecting to exterior electronics wherein the display's overall size is generally not increased by the attachment of these connector pins and the reliability of the connection is improved.

DETAILED DESCRIPTION OF THE DRAWINGS

DETAILED DESCRIPTION OF THE INVENTION

Figure 1:
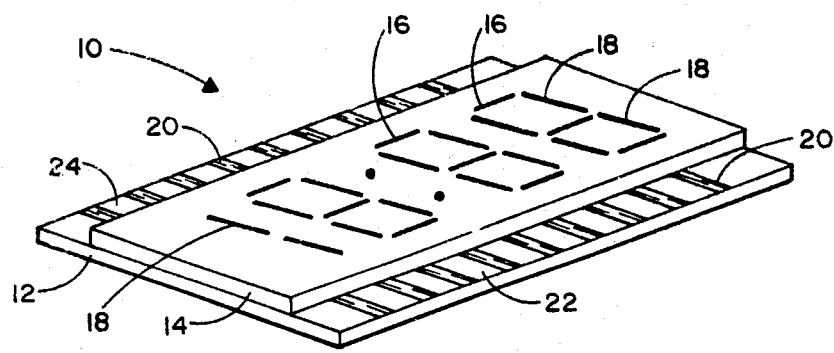
FIG. 1 is a perspective view of an assembled prior art electro-optic display.

An electro-optic display 10 is shown in FIG. 1 having a base plate 12 and an opposing plate 14 which are sealed in face-to-face relation to form an interior envelope. Placed within the envelope are a plurality of character positions 16 which are comprised of a plurality of electrode segments 18. The character positions 16 with the electrodes 18 are designed to be placed on the base plate 12. Opposing electrodes (not shown) are placed on the opposing plate 14 and are designed to operate in conjunction with the electrodes 18 and the character positions 16 to create visible characters to the observer. Some type of display medium, such as an ionizable gas, a liquid crystal material, a vacuum fluorescent or any other type of media which is responsive to activation of electrodes can be placed in the envelope. In order to provide the activation, each of the segments 18 of the character positions 16 are connected by lead lines to termination pads 20 which are along the respective edges 22 and 24 of the base plate 12 which extend beyond the perimeter of the opposing plate 14. Consequently, the termination pads 20 are exposed for receipt of some type of connector.

In order to operate the display 10, it is necessary to connect the electrodes 18 through the termination pads 20 to external electronic addressing means in order to selectively activate the particular character position to form the desired message.

Figure 2:
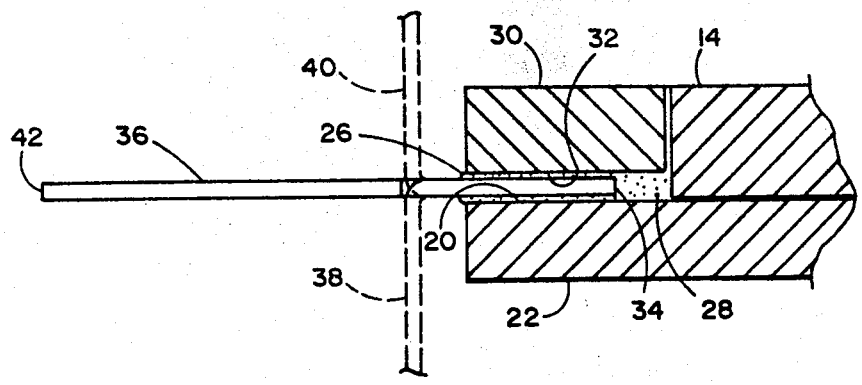
FIG. 2 is a partial sectional view of an electro-optic display incorporating the present invention with a pin connector attached.

Attention is directed to FIG. 2, showing the incorporation of the present invention and to the display device 10 of FIG. 1. Placed on the termination pad surface 20 on the base plate 22 is an adhesive material 26 which has dispersed through it a plurality of conductive particles 28. Placed over the adhesive material 26 is a cover plate 30 which is designed to form the recess 32 which is occupied by the adhesive material 26. Inserted into the recess 32 is one end 34 of a connector pin 36. The spacing between the base plate 22 and the cover plate 30 is such that when the connector pin 36 is inserted into recess 32, the conductor particles 28 will provide a contact between the connector pin 36 and the termination pad 20. The cover member 30 may be used permanently or only temporarily until the material 26 is hardened after which the cover member 30 is removed.

The connector pin 36 can be straight as shown in solid lines in FIG. 2 or it can occupy a position 38 in phantom wherein it is bent at a right angle essentially to the inserted end 34 of the pin and toward the base plate 22. Similarly, it can be oriented in the phantom line position 40 wherein it is at an opposite right angle to the position in 38 with respect to the inserted end 34. Consequently, the orientation of the pin can be easily changed with respect to the use of a connector pin wherein its one end 34 can be inserted into a recess 32. It is assumed that the connector pin 36 could have its free end 42 positioned at any acute angle with respect to the fixed position end 34 depending upon the orientation and location of the interconnect to the driving electronics.

Figure 3:
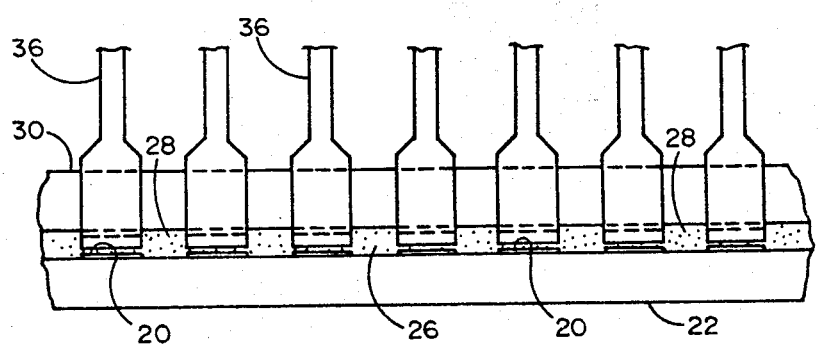
FIG. 3 is a partial edge view of the display device shown in FIG. 2 with the connecting pins bent upward.

As shown in FIG. 3, the dispersion of the conductor particles 28 in the adhesive material 26 is of relative low density, so that there is no possibility that any type of lateral interconnect causing a short circuit could occur laterally between adjacent connector pads 20 or between adjacent connector pins 36. The connector pins in FIG. 3 are shown bent upward in a vertical direction similar to the position 40 as shown in phantom in FIG. 2.

Figure 4:
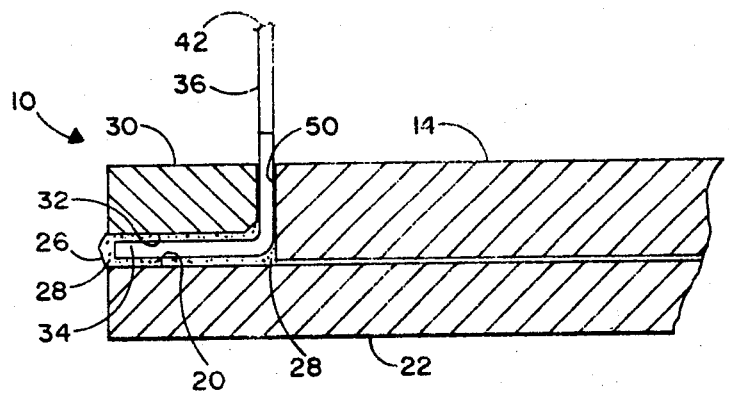
FIG. 4 is a sectional view of an alternate arrangement for connecting the pin to the display utilizing the present invention.

Similarly, as shown in FIG. 4, the orientation of the connector pin 36 can be altered so that it will protrude from the display device 10 adjacent to the opposing plate 14. By using a cover member 30 which has a dimension to allow for a space 50 between the opposing plate 14 and the cover plate 30, it is possible to provide for the exit of connector pin 36 through the space 50. The one end 34 of the connector pin 36 is retained within the recess 32 between the cover plate 30 and the face plate 22. Further, the conductive particles 28 provide the electrical connection to the termination pad 20 on the base plate 22. By having the free end 42 of the connector pin exiting the display device inside the overall perimeter edge 52, the overall size of the display device is not affected by the attachment of the connector pins. Consequently, the space required for the display in an electrical device requiring a display is maintained at a minimum.

It should be noted that regardless of the thickness of the plates 14 and 22 and regardless of the particular spacing of the termination pads 20 on the plates, the same type of connector pin 36 can be utilized when the connector pin is attached using adhesive material 26 having the conductive particles 28 dispersed therein. Therefore, it is not necessary to have custom or even semi-custom connector pins available for particular sized and shaped display devices. The present invention allows for the use of a uniform connector pin arrangement regardless of the configuration of the display.

Figure 5:
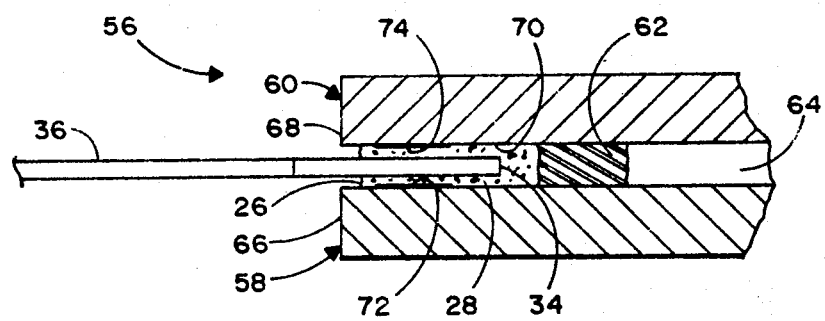
FIG. 5 is a partial sectional view of a second alternate embodiment of the display device incorporating the present invention.

Attention is directed to FIG. 5 showing an alternate embodiment of the present invention. The display device 56 shown in FIG. 5 has a base plate 58 and an opposite plate 60. The seal perimeter 62 which hermetically seals the interior envelope 64 of the display 56 is located at a position inset from the respective edges 66 and 68 of the plates 58 and 60. By having the perimeter seal recessed adjacent one edge of the display 56, a recess area 70 is established into which can be placed adhesive material 26 similar to that shown in FIGS. 2-4. Dispersed in the adhesive material 26 are the similar conductive particles 28. The connector pin 36 can then have its one end 34 inserted into the recess 70 for support by the adhesive material 26 to securely hold it within the recess.

Within the recess 70 located on the interior surface of plate 58 is a termination pad 72 while located on the interior surface of the opposing plate 60 is a termination pad 74. Consequently, it is possible by using a plurality of connector pins 36 to insert the pins into the recess 70 and have different pins interconnect with the termination pad 70 and with the termination pad 74. These respective termination pads 72 and 74 will be laterally offset and, consequently, do not interconnect to the same connector pin 36 by the use of the conductive particles 28 and adhesive material 26. Therefore, this approach would eliminate the requirement of using some type of interconnector clip within the display 56 to bring any type of electrode on the opposing plate 60 down to interconnect to a termination pad 72 on the base plate 58. This particular approach will also eliminate the need for having to utilize a separate cover member such as the cover member 30 used in the device shown in FIGS. 2-4.

Figure 6:
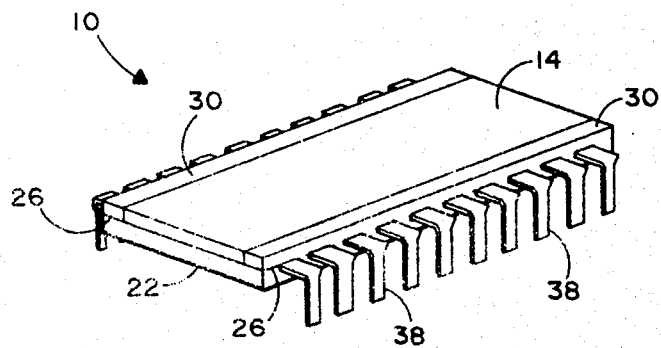
FIG. 6 is a perspective view of the embodiment shown in phantom in FIG. 2.
Figure 7:
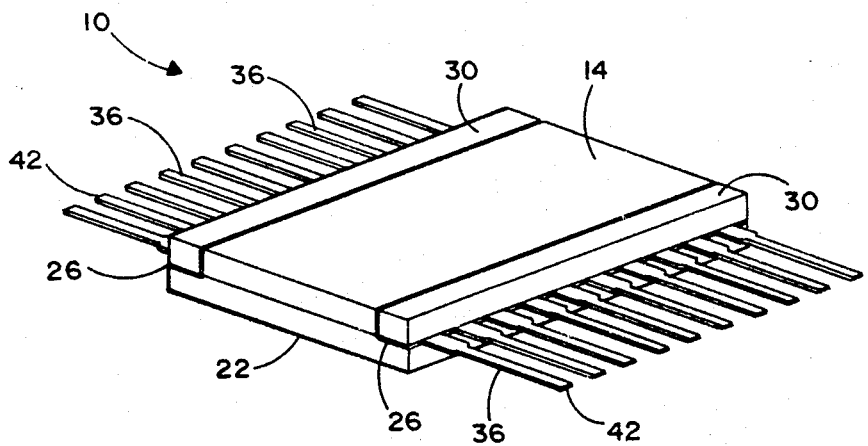
FIG. 7 is a perspective view of the second alternate embodiment shown in FIG. 5.
Figure 8:
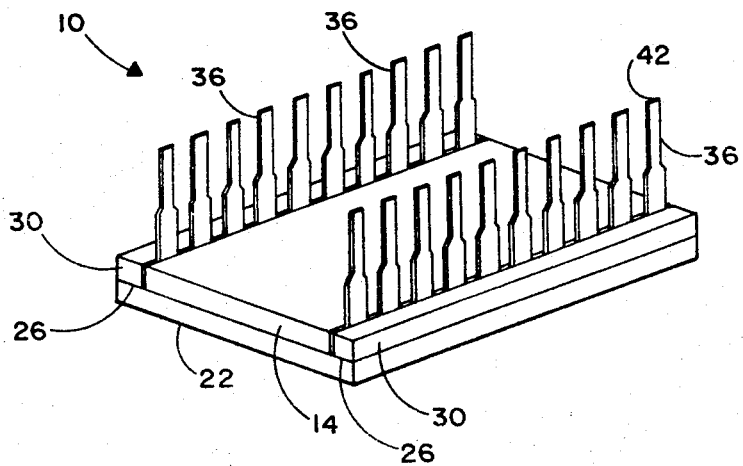
FIG. 8 is a perspective view of the embodiment shown in FIG. 4.

Reference is made to FIG. 6 showing the display device 10 having the connector pins 34 attached to the display and bent to the position 38 as shown and described in FIG. 2. FIG. 7 also shows the display device 10 more clearly with the connector pins 36 in their position as shown with respect to the orientation in solid lines in FIG. 2. FIG. 8 shows the present invention with the display device 10 having the connector pins 34 oriented and connected to the display device in the manner as shown in FIG. 4.

It is assumed that there would be other possible configurations that would be feasible with respect to the utilization of the present invention of incorporating an adhesive material having dispersed therein a plurality of conductive particles. Therefore, it is possible to have the adhesive material and the conductive particles not only physically support the connector pin for attachment to the display device, but also to provide the electrical interconnection between the connector pins and the termination pads on the display. Therefore, the adhesive material with the conductive particles provides a dual function while not requiring any additional physical space to the overall physical dimensions or configuration of the display.

What is claimed is:

1. An electro-optic display comprising:
   a pair of plates in face-to-face relation forming a sealed envelope;
   means within said envelope responsive to exterior addressing electronics for selectively displaying visible characters through a viewing window of said envelope;
   means for connecting said addressinng electronics with said displaying means; and
   an adhesive composition for supporting said connecting means on at least one of said plates, said adhesive composition having conductive particles to provide electrical interface between said connecting means and said displaying means, said particles having a dimension such that no electrical connection exists between adjacent connecting means of said display.

2. An electro-optic display as defined in claim 1, wherein said connecting means comprises a plurality of connector pins, a portion of said pins extending beyond the perimeter of said plates, said adhesive composition support of said pins allowing said portion of said pins to be oriented at any one of a number of positions between pointing toward said viewing window side of said display to pointing toward the side of said display opposite said viewing window side.

3. An electro-optic display as defined in claim 1, wherein said connecting means comprises a plurality of connecting pins and wherein said plates comprise a specified exterior perimeter, said adhesive composition for supporting said pins on said plates not increasing said specified exterior perimeter of said plates.

4. An electro-optic display device comprising:
   a first plate;
   a second plate sealed in spaced face-to-face relation with said first plate to form an envelope;
   electrode means within said envelope and responsive to electrical activation to form selectable characters;
   connector pins for interfacing said electrode means with exterior addressing electronics;
   adhesive means for supporting said pins between said plates of said display and for providing electrical attachment of said pins to electrode means; and
   conductive particles within said adhesive means, said particles being located between said pins and said first plate as well as between said pins and said second plate.

5. An electro-optic display device as defined in claim 4, wherein said first and second plates have a specified thickness, the interface of said pins and said adhesive means is designed in such a manner so that said specified thickness of said plates is not increased.

6. An electro-optic display device as defined in claim 4, wherein one of said plates has a specified perimeter, said adhesive means supports said connector pins in such a manner that said connector pins do not increase the perimeter of said display beyond the edge perimeter of said one of said plates.

7. An electro-optic display device comprising:
   a first plate;
   a second plate sealed in face-to-face relation with said first plate to form an interior envelope, one of said plates being larger than the other of said plates so that one edge of said one of said plates extends beyond an adjacent edge of said other of said plates;
   electrode means on at least one of said plates within said envelope;
   termination pads on said one edge of said one of said plates;
   means for interconnecting said electrode means with said termination pads;
   adhesive means placed on said termination pads;
   a plurality of connector pins placed in said adhesive means, said connector pins only contacting said adhesive means on said display; and
   conductive means in said adhesive means to establish electrical communication between said connector pins and said termination pads, said adhesive means being the only support for said connector pins on said display.

8. An electro-optic display device as defined in claim 7, and additionally comprising an enclosing member positioned over said adhesive means adjacent said one edge to form a recess bounding said adhesive means and said plurality of connector pins.

9. An electro-optic display device comprising:
   a first insulating plate;
   a second insulating plate sealed parallel and spaced from said first insulating plate to form an interior envelope, said plates extending beyond said envelope adjacent one side of said display to form a recess;
   a plurality of first electrodes on one of said plates and having a plurality of associated lead terminals terminating along an edge of said one of said plates within said recess;
   at least one second electrode on the other of said plates and having a lead terminal along an edge of said other of said plates within said recess, said lead terminals of said first and second electrodes being on opposing surfaces of said plates within said recess;
   a plurality of connecting pins inserted in said recess; and
   adhesive means in said recess for supporting and for electrically connecting said pins to said lead terminals.

* * * * *